US012798421B2

(12) United States Patent
Tsuchiya et al.

(10) Patent No.: US 12,798,421 B2
(45) Date of Patent: Nov. 17, 2026

(54) CHARGING CONTROL DEVICE

(71) Applicant: TOYOTA JIDOSHA KABUSHIKI KAISHA, Toyota (JP)

(72) Inventors: Yoshiyuki Tsuchiya, Nagoya (JP); Kazuyuki Yokota, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 787 days.

(21) Appl. No.: 18/203,928

(22) Filed: May 31, 2023

(65) Prior Publication Data

US 2023/0398892 A1 Dec. 14, 2023

(30) Foreign Application Priority Data

Jun. 14, 2022 (JP) ................................ 2022-095963

(51) Int. Cl.
*B60L 53/62* (2019.01)
*B60L 53/20* (2019.01)
(Continued)

(52) U.S. Cl.
CPC ............... *B60L 53/62* (2019.02); *B60L 53/20* (2019.02); *B60L 58/26* (2019.02); *H01M 10/613* (2015.04); *H01M 10/633* (2015.04); *B60H 1/00278* (2013.01); *B60L 58/12* (2019.02); *B60L 58/13* (2019.02); *B60L 2240/545* (2013.01); *B60L 2240/80* (2013.01); *B60L 2260/58* (2013.01); *B60W 2510/244* (2013.01); *H01M 10/443* (2013.01); *H01M 10/625* (2015.04); *H01M 2220/20* (2013.01);
(Continued)

(58) Field of Classification Search
CPC ... H01M 10/613; H01M 10/633; B60L 53/62; B60L 53/20; B60L 58/26
USPC ......................... 320/109, 134, 144, 150–154
See application file for complete search history.

(56) References Cited

U.S. PATENT DOCUMENTS 5,650,710 A * 7/1997 Hotta ...................... B60L 53/14 320/155
5,686,812 A * 11/1997 Hotta ...................... H02J 7/865 320/152
(Continued)

FOREIGN PATENT DOCUMENTS

CN 107117044 A 9/2017
CN 113043863 A 6/2021
(Continued)

*Primary Examiner* — John T Trischler
(74) *Attorney, Agent, or Firm* — Dinsmore & Shohl LLP

(57) ABSTRACT

A device includes one or more processors configured to: specify a necessary charge amount of the power storage device; and control the conversion device such that the power storage device is charged at a high power level up to a predetermined charge amount reachable to the specified necessary charge amount, and such that the power storage device is charged at a low power level after the predetermined charge amount has been reached, the low power level being a level of charging power at which an appropriate temperature range is maintained by cooling control at a low drive level of the cooling device, the high power level being a level of charging power at which the appropriate temperature range is maintained by cooling control at a high drive level at which cooling performance is higher than cooling performance of the low drive level.

13 Claims, 5 Drawing Sheets

(51) Int. Cl.
*B60L 58/20* (2019.01)
*B60L 58/26* (2019.01)
*H01M 10/613* (2014.01)
*H01M 10/633* (2014.01)
*B60H 1/00* (2006.01)
*B60L 58/12* (2019.01)
*B60L 58/13* (2019.01)
*H01M 10/44* (2006.01)
*H01M 10/625* (2014.01)
*H05K 7/20* (2006.01)

(52) U.S. Cl.
CPC ....... *H05K 7/20927* (2013.01); *Y02T 10/7072* (2013.01); *Y02T 90/14* (2013.01)

(56) References Cited

U.S. PATENT DOCUMENTS 5,871,859 A * 2/1999 Parise .......... F01N 3/2006 429/62
6,057,050 A * 5/2000 Parise .......... F01N 3/2006 429/7
6,330,925 B1 * 12/2001 Ovshinsky .......... B60K 6/24 180/68.5
6,557,655 B2 * 5/2003 Ovshinsky .......... B60K 6/46 180/65.245
6,837,321 B2 * 1/2005 Ovshinsky .......... H01M 4/383 180/65.245
7,510,797 B2 * 3/2009 Aker .......... H01M 50/253 429/50
7,651,811 B2 * 1/2010 Aker .......... H01M 10/6551 429/71
7,755,329 B2 * 7/2010 Kohn .......... B60L 1/003 320/152
7,767,354 B2 * 8/2010 Saito .......... H01M 10/482 429/433
7,859,220 B2 * 12/2010 Bushong .......... H02J 7/751 429/100
7,911,184 B2 * 3/2011 Kohn .......... B60L 1/003 701/22
7,928,699 B2 * 4/2011 Kohn .......... B60L 1/003 307/31
7,947,387 B2 * 5/2011 Saito .......... H01M 10/482 429/61
8,117,857 B2 * 2/2012 Kelty .......... B60L 58/16 62/244
8,219,248 B2 * 7/2012 Aridome .......... B60L 58/26 318/519
8,274,262 B2 * 9/2012 Harada .......... B60L 1/02 320/137
8,368,347 B2 * 2/2013 Mitsutani .......... B60L 53/14 320/104
8,368,354 B2 * 2/2013 Endo .......... H01M 10/425 320/109
8,418,789 B2 * 4/2013 Nakamura .......... H01M 10/486 318/473
8,718,851 B2 * 5/2014 Kamijo .......... B60W 10/30 701/22
8,818,598 B2 * 8/2014 Izumi .......... B60L 15/20 701/22
8,899,492 B2 * 12/2014 Kelty .......... B60L 58/16 320/150
8,935,023 B2 * 1/2015 Hirota .......... H01M 10/66 701/22
8,935,029 B2 * 1/2015 Sabrie .......... H01M 10/6563 165/41
9,013,138 B2 * 4/2015 Nomura .......... B60L 53/14 320/124
9,059,590 B2 * 6/2015 Cassidy .......... H02J 7/485
9,126,585 B2 * 9/2015 Takizawa .......... B60L 53/14
9,252,622 B2 * 2/2016 Iida .......... H02J 7/977
9,263,912 B2 * 2/2016 Verdun .......... H02J 7/04
9,331,507 B2 * 5/2016 Srinivasan .......... H02J 7/00
9,352,635 B1 * 5/2016 Schepmann .......... B60H 1/00392
9,403,439 B2 * 8/2016 Nakasako .......... B60L 58/20
9,446,667 B2 * 9/2016 Smajlovic .......... B60L 1/04
9,555,715 B2 * 1/2017 Sugano .......... B60L 53/30
9,831,700 B2 * 11/2017 Verdun .......... H02J 7/04
9,859,709 B2 * 1/2018 Sakamoto .......... B60L 1/00
9,895,997 B2 * 2/2018 Takizawa .......... B60L 58/21
9,969,288 B2 * 5/2018 Ikeda .......... B60L 53/14
9,981,568 B2 * 5/2018 Minamiura .......... B60L 58/13
10,144,295 B2 * 12/2018 Ghebru .......... B60L 53/00
10,203,736 B2 * 2/2019 Lam .......... G06F 1/1669
10,297,883 B2 * 5/2019 Izumi .......... H01M 10/48
10,300,808 B2 * 5/2019 Newman .......... B60L 58/13
10,315,529 B2 * 6/2019 Araki .......... B60L 53/66
10,337,390 B2 * 7/2019 Lee .......... B60L 53/14
10,381,695 B2 * 8/2019 Ochiai .......... H01M 10/0525
10,403,942 B2 * 9/2019 Izumi .......... H01M 10/6563
10,439,417 B2 * 10/2019 Murata .......... B60L 1/02
10,486,540 B2 * 11/2019 Tsuchiya .......... B60L 58/12
10,714,956 B2 * 7/2020 Gleason .......... H02J 7/485
10,967,750 B2 * 4/2021 Lee .......... B60L 53/14
11,056,903 B2 * 7/2021 Lim .......... H01M 10/44
11,400,818 B2 * 8/2022 Kobayashi .......... B60L 58/20
11,440,491 B2 * 9/2022 Sakabe .......... B60K 11/02
11,451,079 B2 * 9/2022 Gleason .......... H02J 7/485
11,491,887 B2 * 11/2022 Tsuchiya .......... B60L 53/60
11,518,273 B2 * 12/2022 Tokozakura .......... H01M 10/625
11,695,292 B2 * 7/2023 Sakamoto .......... B60L 53/20 307/82
11,858,370 B2 * 1/2024 Matsuyama .......... B60L 1/003
11,858,371 B2 * 1/2024 Ando .......... B60L 58/26
11,955,616 B2 * 4/2024 Tsuchiya .......... B60L 55/00
12,046,926 B2 * 7/2024 Sun .......... H02J 50/10
12,068,630 B2 * 8/2024 Geddadi .......... H01M 10/44
12,157,386 B2 * 12/2024 Tsuchiya .......... B60L 53/63
12,214,697 B2 * 2/2025 Ogaki .......... B60L 58/26
12,325,324 B1 * 6/2025 Bennett .......... B60L 58/13
2002/0121396 A1 * 9/2002 Ovshinsky .......... H01M 10/615 180/68.5
2003/0118891 A1 * 6/2003 Saito .......... H01M 10/482 429/62
2003/0188901 A1 * 10/2003 Ovshinsky .......... H01M 10/615 180/65.245
2005/0088140 A1 * 4/2005 Bushong .......... H02J 7/751 320/107
2005/0162829 A1 * 7/2005 Aker .......... H01M 10/6553 361/695
2006/0188776 A1 * 8/2006 Aker .......... H01M 50/209 429/50
2009/0024252 A1 * 1/2009 Aridome .......... B60L 58/30 700/275
2009/0243549 A1 * 10/2009 Matsumura .......... H01M 10/44 320/155
2010/0072954 A1 * 3/2010 Kohn .......... B60L 1/003 320/152
2010/0123438 A1 * 5/2010 Harada .......... H01M 10/48 180/65.29
2010/0134073 A1 * 6/2010 Kohn .......... B60L 1/003 320/152
2010/0155162 A1 * 6/2010 Nakamura .......... H01M 10/633 318/473
2010/0191398 A1 * 7/2010 Hirota .......... B60L 58/10 320/101
2010/0212339 A1 * 8/2010 Kelty .......... B60L 58/26 62/157
2010/0239894 A1 * 9/2010 Saito .......... H01M 10/482 429/50
2011/0227534 A1 * 9/2011 Mitsutani .......... B60L 53/14 320/109
2011/0278920 A1 * 11/2011 Sakamoto .......... B60L 1/00 307/10.1
2011/0316486 A1 * 12/2011 Inaba .......... H01M 10/48 320/150
2012/0021258 A1 * 1/2012 Kelty .......... H01M 10/625 429/50
2012/0112696 A1 * 5/2012 Ikeda .......... B60L 53/14 320/109

(56) References Cited

U.S. PATENT DOCUMENTS

2012/0268066 A1* 10/2012 Endo ..................... B60W 10/26 320/109
2012/0326655 A1* 12/2012 Nomura .................. B60L 53/14 320/107
2013/0020864 A1* 1/2013 Smajlovic ................. B60L 1/04 307/9.1
2013/0079969 A1* 3/2013 Kamijo ................. B60W 50/06 180/65.23
2013/0096760 A1* 4/2013 Izumi ...................... B60L 15/20 701/22
2013/0116877 A1* 5/2013 Sabrie ................... H01M 16/00 165/41
2013/0249483 A1* 9/2013 Iida ......................... H02J 7/977 320/109
2013/0264999 A1* 10/2013 Srinivasan .......... H01M 10/486 320/150
2014/0012447 A1* 1/2014 Gao ........................ B60L 58/13 701/22
2014/0217958 A1* 8/2014 Verdun ..................... H02J 7/04 320/134
2014/0236410 A1* 8/2014 Takizawa ................ B60L 58/13 180/65.265
2014/0239881 A1* 8/2014 Cassidy .................. H02J 7/485 320/107
2014/0268556 A1* 9/2014 Lam ........................ G06F 1/263 361/679.55
2014/0347017 A1* 11/2014 Sugano ................... B60L 53/30 320/137
2015/0263541 A1* 9/2015 Fukui .................... B60L 3/0046 320/134
2015/0274022 A1* 10/2015 Nakasako ............... B60L 58/14 290/45
2016/0107534 A1* 4/2016 Ikeda ...................... B60L 53/14 307/9.1
2016/0121735 A1* 5/2016 Sugano ..................... B60L 3/00 320/109
2016/0126760 A1* 5/2016 Murata ..................... B60L 1/02 320/107
2016/0126762 A1* 5/2016 Verdun ..................... H02J 7/04 320/162
2016/0301114 A1* 10/2016 Izumi .................. H01M 10/625
2016/0301116 A1* 10/2016 Ochiai .............. H01M 10/6563
2016/0301119 A1* 10/2016 Izumi ................ H01M 10/6563
2017/0088009 A1* 3/2017 Takizawa ................ B60L 58/12
2017/0240058 A1 8/2017 Ghebru et al.
2017/0305292 A1* 10/2017 Minamiura ............. B60L 58/26
2018/0072182 A1* 3/2018 Araki .................. H01M 10/486
2018/0194238 A1* 7/2018 Tsuchiya ................. B60L 58/12
2018/0241098 A1* 8/2018 Kang .................. H01M 10/443
2018/0304765 A1* 10/2018 Newman ................. B60L 58/26
2019/0036350 A1* 1/2019 Gleason .................. H02J 7/485
2019/0229547 A1* 7/2019 Lim ...................... H01M 10/44
2019/0381898 A1* 12/2019 Kobayashi .............. B60L 58/27
2020/0231060 A1* 7/2020 Matsuyama ............ B60L 1/003
2020/0343737 A1* 10/2020 Gleason .................. H02J 7/485
2020/0353791 A1* 11/2020 Sakabe .................. B60K 11/04
2020/0406783 A1* 12/2020 Tokozakura ........ H01M 10/633
2021/0053459 A1* 2/2021 Tsuchiya ............. H01M 10/441
2021/0107371 A1* 4/2021 Tsuchiya ................. B60L 53/60
2021/0284039 A1* 9/2021 Ando ...................... H04W 4/44
2021/0376402 A1* 12/2021 Tsuchiya ................. B60L 55/00
2021/0376647 A1* 12/2021 Geddadi ............... H01M 10/44
2022/0016958 A1* 1/2022 Komazawa ........ B60H 1/00278
2022/0289060 A1* 9/2022 Tsuchiya ................. B60L 53/63
2022/0302730 A1* 9/2022 Sakamoto ............... B60L 53/20
2022/0302770 A1* 9/2022 Sun ......................... H02J 50/10
2023/0055574 A1* 2/2023 O ............................ H02J 7/975
2023/0130832 A1* 4/2023 Dunn ...................... B60L 53/62 320/109
2023/0234474 A1* 7/2023 Ogaki ..................... B60L 58/26
2023/0291221 A1* 9/2023 Kamijoh .................. H02J 7/92
2024/0198837 A1* 6/2024 Nakamura .............. B60L 53/62
2024/0270115 A1* 8/2024 Sasaki ..................... B60L 58/12
2025/0079553 A1* 3/2025 Michishita .............. B60L 58/26
2025/0206194 A1* 6/2025 Takesue .................. B60L 58/26

FOREIGN PATENT DOCUMENTS

CN 113799651 A 12/2021
DE 102016202807 A1 8/2017
EP 3306773 A1 4/2018
JP 2007-336691 A 12/2007
JP 2010-233360 A 10/2010
JP 5213180 B2 6/2013

* cited by examiner

CHARGING CONTROL DEVICE

CROSS-REFERENCE TO RELATED APPLICATION

This application claims priority to Japanese Patent Application No. 2022-095963 filed on Jun. 14, 2022, incorporated herein by reference in its entirety.

BACKGROUND

1. Technical Field

The present disclosure relates to a charging control device, and more particularly, to a charging control device that controls external charging of a vehicle.

2. Description of Related Art

There is the following battery cooling control system for a vehicle. When quick charging can be performed and a noise level relationship is determined to be a relationship in which a vehicle noise level is higher than a fan noise level in a state in which the quick charging is performed, the operation level of a battery cooling fan is set to a high cooling level. When determination is made otherwise, the operation level of the battery cooling fan is set to a medium cooling level at which the cooling performance is higher than that of a normal level and is lower than that of the high cooling level (see, for example, Japanese Unexamined Patent Application Publication No. 2007-336691 (JP 2007-336691 A)).

SUMMARY

As described in JP 2007-336691 A, driving noise of a cooling device such as the battery cooling fan during charging is taken as a concern. JP 2007-336691 A discloses a technology in which, when the noise level required from a vehicle speed or a volume setting of an on-board device is high, determination is made that the driving noise of the battery cooling fan has little influence and the battery cooling fan is driven at a high cooling level. This technology has the following problem. When external charging is performed while the vehicle is stopped, there is no noise from traveling or from the on-board device. Therefore, there is no such situation that the battery cooling fan can be driven at a high cooling level.

The present disclosure provides a charging control device capable of reducing influence of driving noise of a cooling device during charging.

A charging control device according to a first aspect of the present disclosure is a charging control device configured to control external charging of a vehicle, the vehicle including a power storage device configured to store electric power for traveling of the vehicle, a conversion device configured to convert electric power from an outside of the vehicle into electric power adapted to the power storage device, a cooling device configured to cool at least one of the power storage device and the conversion device, and the charging control device, the charging control device includes: one or more processors configured to: control the conversion device and the cooling device; specify a necessary charge amount of the power storage device; and control the conversion device such that the power storage device is charged at a high power level up to a predetermined charge amount reachable to the specified necessary charge amount, and such that the power storage device is charged at a low power level after the predetermined charge amount has been reached, the low power level being a level of charging power at which an appropriate temperature range is maintained by cooling control at a low drive level of the cooling device, the high power level being higher than the low power level in terms of charging power and being a level of charging power at which the appropriate temperature range is not maintained by the cooling control at the low drive level but is maintained by cooling control at a high drive level at which cooling performance is higher than cooling performance of the low drive level.

A charging control device according to a second aspect of the present disclosure is a charging control device configured to control external charging of a vehicle, the vehicle including a power storage device configured to store electric power for traveling of the vehicle, a conversion device configured to convert electric power from an outside of the vehicle into electric power adapted to the power storage device, a cooling device configured to cool at least one of the power storage device and the conversion device, and the charging control device, the charging control device includes: one or more processors configured to: control the conversion device and the cooling device; specify a necessary charge amount of the power storage device; specify an expected time of completion of charging; control the conversion device such that the power storage device is charged at a low power level when the specified expected time is later than a completion time obtained by adding a period required for charging to the specified necessary charge amount at the low power level to a time at a start of charging; and control, when the expected time is not later than the completion time, the conversion device such that the power storage device is charged at a high power level up to a predetermined charge amount reachable to the specified necessary charge amount by the expected time, and to charge the power storage device at the low power level after the predetermined charge amount has been reached, the low power level being a level of charging power at which an appropriate temperature range is maintained by cooling control at a low drive level of the cooling device, the high power level being higher than the low power level in terms of charging power and being a level of charging power at which the appropriate temperature range is not maintained by the cooling control at the low drive level but is maintained by cooling control at a high drive level at which cooling performance is higher than cooling performance of the low drive level.

According to the present disclosure, it is possible to provide the charging control device capable of reducing the influence of the driving noise of the cooling device during the charging.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

Embodiments of the present disclosure will be described with reference to the accompanying drawings. In the following description, the same components are denoted with the same signs. Their names and functions are also the same. Accordingly, detailed description of these components will not be repeated.

Hereinafter, description will be given about an exemplary configuration in which a battery system according to the present disclosure is mounted on a vehicle. The application of the battery system according to the present disclosure is not limited to the vehicle, and may be, for example, a stationary use or other uses.

First Embodiment

Figure 1:
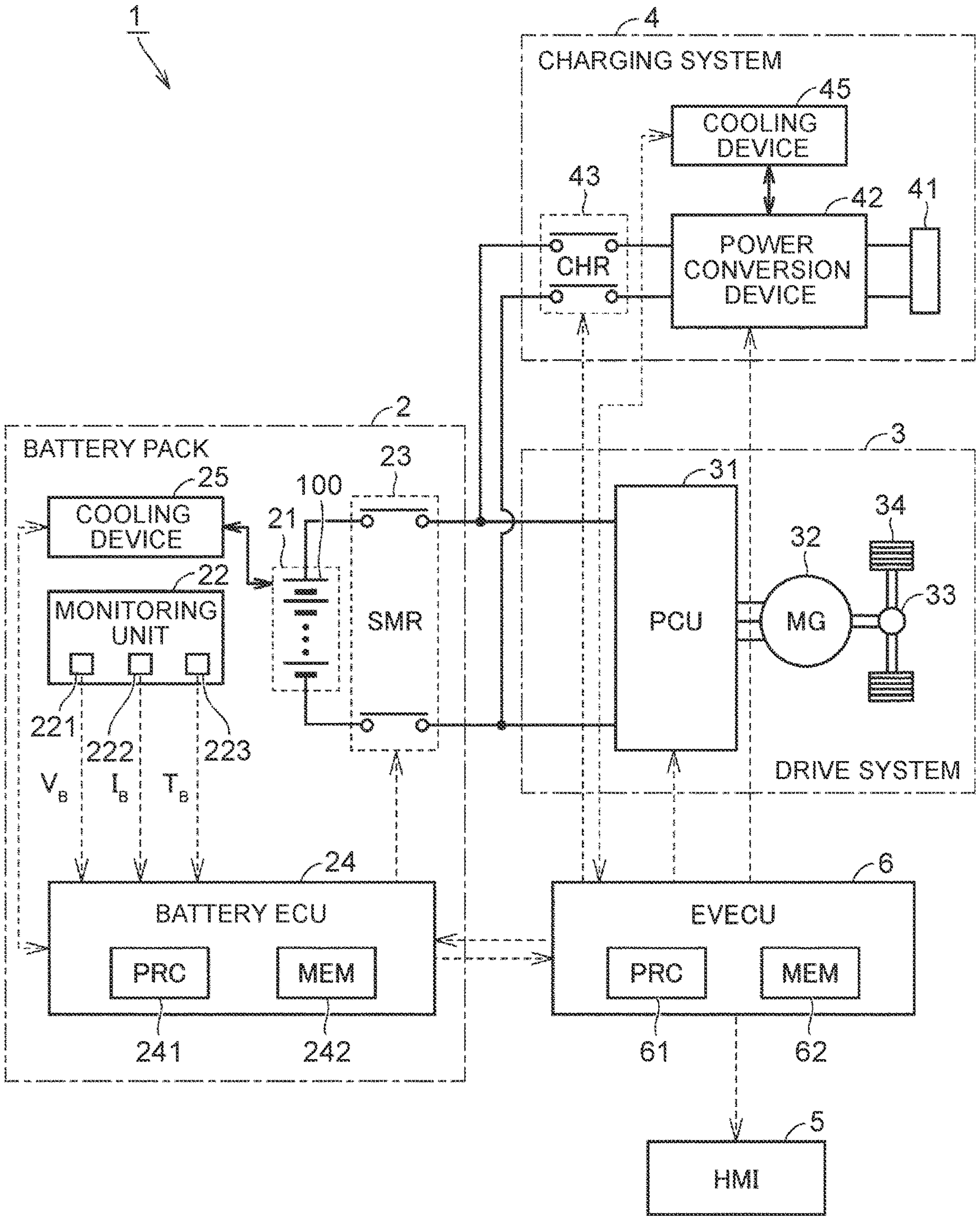
FIG. 1 is a diagram schematically showing an overall configuration of a vehicle including a battery system according to embodiments of the present disclosure.

FIG. 1 is a diagram schematically showing an overall configuration of a vehicle 1 including the battery system according to the embodiments of the present disclosure. Referring to FIG. 1, the vehicle 1 is, for example, a battery electric vehicle (BEV). However, the vehicle that can include this battery system is not limited to the battery electric vehicle. The battery system can be mounted on general vehicles that generate a driving force by using electric power supplied from the battery system. The vehicle 1 may be a hybrid electric vehicle (HEV), a plug-in hybrid electric vehicle (PHEV), or a fuel cell electric vehicle (FCEV).

The vehicle 1 includes a battery pack 2, a drive system 3, a charging system 4, a human-machine interface (HMI) 5, and an electric vehicle electronic control unit (EVECU) 6. The battery pack 2 includes a battery 21, a monitoring unit 22, a system main relay (SMR) 23, a battery ECU 24, and a cooling device 25. The drive system 3 includes a power control unit (PCU) 31, a motor generator 32, a power transmission gear 33, and drive wheels 34. The charging system 4 includes an inlet 41, a power conversion device 42, a charging relay 43, and a cooling device 45.

The battery 21 is an assembled battery. The battery 21 includes a plurality of blocks (also referred to as "modules"). Each of the blocks includes one or more cells 100. Each cell 100 is a secondary battery, and is a lithium ion battery in the present embodiment. The battery 21 stores electric power for driving the motor generator 32, and supplies the electric power to the motor generator 32 through the PCU 31. The battery 21 is charged with electric power generated by the motor generator 32 and received through the PCU 31.

The monitoring unit 22 includes various sensors for monitoring the battery 21. Specifically, the monitoring unit 22 includes a voltage sensor 221, a current sensor 222, and a temperature sensor 223. The voltage sensor 221 detects a voltage VB of each cell 100. The current sensor 222 detects a current $I_B$ charged to or discharged from the battery 21. In the present embodiment, a discharge current has a positive value. The temperature sensor 223 detects a temperature TB of the battery 21. Each sensor outputs a signal indicating a detection result to the battery ECU 24.

The SMR 23 is electrically connected to power lines connecting the battery 21 and the PCU 31. The SMR 23 is opened or closed in response to a command from the battery ECU 24.

The battery ECU 24 includes a processor 241 such as a central processing unit (CPU), a memory 242 such as a read only memory (ROM) and a random access memory (RAM), and an input-output port (not shown) for inputting and outputting various signals. The processor 241 monitors the battery 21 based on signals received from the sensors and programs and maps stored in the memory 242. More specifically, the battery ECU 24 calculates a state of charge (SOC) of the battery 21.

The PCU 31 is electrically connected between the SMR 23 and the motor generator 32. The PCU 31 includes a converter and an inverter (both not shown). The PCU 31 drives the motor generator 32 by using electric power discharged from the battery 21 in response to a command from the EVECU 6.

The motor generator 32 is, for example, a permanent magnet synchronous motor including a rotor with embedded permanent magnets. An output torque of the motor generator 32 is transmitted to the drive wheels 34 through the power transmission gear 33 to cause the vehicle 1 to travel. The motor generator 32 can generate electric power (regenerative power) by using a rotational force of the drive wheels 34 during a braking operation of the vehicle 1. The electric power generated by the motor generator 32 is converted into electric power for charging the battery 21 by the PCU 31.

The inlet 41 is configured such that a charging connector (not shown) provided at the tip of a charging cable can be connected by mechanical coupling. Electrical connection between charging equipment (not shown) and the vehicle 1 is secured by connecting the inlet 41 and the charging connector.

The power conversion device 42 is, for example, an alternating current-to-direct current (AC-DC) converter. The power conversion device 42 converts AC power supplied from the charging equipment via the charging cable into DC power in response to a command from the EVECU 6 to charge the battery 21 (external charging). The power conversion device 42 can also convert DC power stored in the battery 21 into AC power and discharge it to an external load (not shown) connected to the inlet 41 in response to a command from the EVECU 6 (external power feeding). The power conversion device 42 may include a DC-DC converter in addition to the AC-DC converter, and convert high-voltage DC power supplied from the charging equipment via the charging cable into DC power having a voltage suitable for charging the battery 21 in response to a command from the EVECU 6, thereby charging the battery 21.

The charging relay 43 is electrically connected to power lines connecting the SMR 23 and the PCU 31. The charging relay 43 is opened or closed in response to a command from the EVECU 6.

The HMI 5 includes an input device and a display device (both not shown) to receive user's operations and display various types of information. More specifically, the HMI 5 includes, for example, an instrument panel, a head-up display (HUD), and a navigation screen. The instrument panel is a dashboard on which meters are mounted. A multi-information display (MID) may also be employed in place of the instrument panel. The HUD projects various types of information as virtual images on a forward side of the driver's field of view. The navigation screen is a display of a navigation system.

Similarly to the battery ECU 24, the EVECU 6 includes a processor 61, a memory 62, and an input-output port (not shown). The EVECU 6 centrally controls the vehicle 1 based on signals received from the sensors and programs and maps stored in the memory 62. For example, the EVECU 6 controls the charging and discharging of the battery 21 by controlling the PCU 31 or the power conversion device 42 in cooperation with the battery ECU 24. Although the battery ECU 24 and the EVECU 6 are configured separately in FIG. 1, the battery ECU 24 and the EVECU 6 may be configured integrally.

The cooling device 25 of the battery pack 2 cools the battery 21. The cooling device 45 of the charging system 4 cools the power conversion device 42. The cooling devices 25 and 45 are water-cooling devices, and each include an electric water pump that circulates a coolant for cooling a cooling target (battery 21 or power conversion device 42 in the present embodiment), and an electric cooling fan that sends cooling air to a radiator that cools the circulating coolant.

The cooling targets of the cooling devices 25 and 45 may be at least one of the battery 21 and the power conversion device 42, or may include any other device in the power system of the vehicle 1, such as the PCU 31 or the motor generator 32.

The cooling devices 25 and 45 may be air-cooling devices each configured to send cooling air to the cooling target by an electric air-cooling blower and cool the cooling target with the cooling air, or refrigerant-type devices each configured to circulate a refrigerant compressed by an electric compressor and cool the cooling target with the refrigerant.

There is the following system. When quick charging can be performed and a noise level relationship is determined to be a relationship in which a noise level of the vehicle 1 is higher than a fan noise level in a state in which the quick charging is performed, the operation level of the cooling device 25 or 45 such as a cooling fan for the battery 21 is set to a high cooling level. When determination is made otherwise, the operation level of the cooling device 25 or 45 is set to a medium cooling level at which the cooling performance is higher than that of a normal level and is lower than that of the high cooling level.

Driving noise of the cooling devices 25 and 45 during charging is taken as a concern. When the noise level required from a vehicle speed or a volume setting of an on-board device is high, determination may be made that the driving noise of the cooling devices 25 and 45 has little influence and the cooling devices 25 and 45 may be driven at a high cooling level. In this case, the following problem may arise. When external charging is performed while the vehicle 1 is stopped, there is no noise from traveling or from the on-board device. Therefore, there is no such situation that the cooling devices 25 and 45 can be driven at the high cooling level.

Therefore, the EVECU 6 and the battery ECU 24 specify a necessary charge amount of the battery 21. The necessary charge amount is an amount of charge necessary for next traveling. The power conversion device 42 is controlled such that the battery 21 is charged at a high power level up to a predetermined charge amount reachable to the specified necessary charge amount and the battery 21 is charged at a low power level after the predetermined charge amount has been reached. The low power level is a level of charging power at which an appropriate temperature range can be maintained by cooling control at a low drive level of the cooling devices 25 and 45. The high power level higher than the low power level is a level of charging power at which the appropriate temperature range cannot be maintained by the cooling control at the low drive level but can be maintained by cooling control at a high drive level at which the cooling performance is higher than that of the low drive level.

Therefore, the battery 21 is charged, up to the predetermined charge amount reachable to the necessary charge amount, at the high power level at which the appropriate temperature range cannot be maintained unless the cooling control is performed at the high drive level, and the battery 21 is charged, after the predetermined charge amount has been reached, at the low power level at which the appropriate temperature range can be maintained by the cooling control at the low drive level. Thus, it is possible to minimize the influence of noise of the cooling devices 25 and 45 at the high drive level. As a result, it is possible to reduce the influence of the driving noise of the cooling devices 25 and 45 during the charging.

Figure 2:
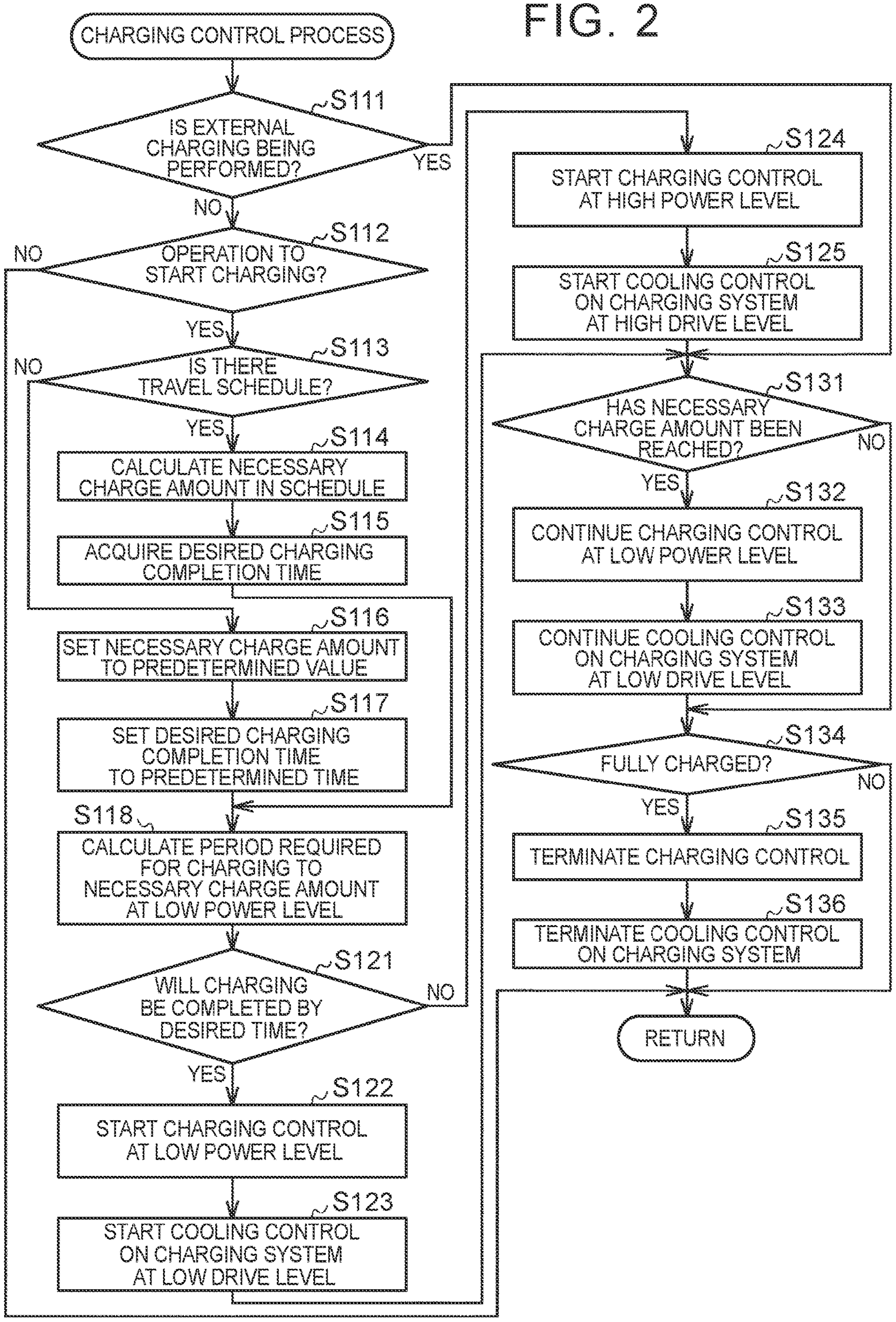
FIG. 2 is a flowchart showing a flow of a charging control process in a first embodiment.

FIG. 2 is a flowchart showing a flow of a charging control process in the first embodiment. Referring to FIG. 2, the charging control process is executed by being called from a higher-level process by the EVECU 6 at predetermined control cycles.

The processor 61 of the EVECU 6 determines whether the external charging of the battery 21 is being performed (Step S111). When determination is made that the external charging is not being performed (NO in Step S111), the processor 61 of the EVECU 6 determines whether the user has performed an operation to start charging (Step S112). When determination is made that the operation to start charging has not been performed (NO in Step S112), the processor 61 of the EVECU 6 returns the process to be executed to the higher-level process that has called the charging control process.

When determination is made that the operation to start charging has been performed (YES in Step S112), the processor 61 of the EVECU 6 determines whether the vehicle 1 is scheduled to travel (Step S113). For example, when a destination and a scheduled departure time are input to the navigation system, determination is made that there is a schedule to travel toward the destination at the scheduled departure time. When the vehicle 1 is regularly used for commuting on weekdays, determination is made that there is a schedule to travel to work at a usual departure time for commuting on weekdays.

When determination is made that there is a travel schedule (YES in Step S113), the processor 61 of the EVECU 6 calculates a necessary charge amount in the travel schedule (Step S114). The necessary charge amount is calculated based on information such as a fuel efficiency of the vehicle 1, a distance to the destination in the travel schedule, and slopes on a route.

Next, the processor 61 of the EVECU 6 acquires a desired charging completion time (Step S115). For example, when a scheduled departure time is included in the travel schedule, a time earlier by a predetermined period than the scheduled departure time (may be, for example, a time earlier by one hour than the scheduled departure time or the same time as the scheduled departure time) is acquired as the desired charging completion time.

When determination is made that there is no travel schedule (NO in Step S113), the processor 61 of the EVECU 6 sets the necessary charge amount to a predetermined value (may be, for example, a charge amount corresponding to a predetermined state of charge (SOC) such as 80%, the highest necessary charge amount based on a history, or an average necessary charge amount based on the history) (Step S116), and sets the desired charging completion time to a predetermined time (may be, for example, a predetermined time such as 7 a.m., a departure time with the highest frequency, or the earliest departure time based on the history) (Step S117).

After Step S115 or S117, the processor 61 of the EVECU 6 calculates a period required for charging to the necessary charge amount at the low power level (Step S118). The low power level is assumed to be a constant value of 3 kW AC. The high power level is higher than the low power level, and is assumed to be a constant value of 22 kW AC.

The processor 61 of the EVECU 6 determines whether an expected charging completion time obtained by adding the charging period calculated in Step S118 to a current time is earlier than the desired charging completion time, that is, whether the charging will be completed by the desired charging completion time (Step S121).

When determination is made that the charging will be completed by the desired charging completion time (YES in Step S121), the processor 61 of the EVECU 6 controls the power conversion device 42 to start charging control at the low power level (Step S122). The processor 61 of the EVECU 6 directly controls the cooling device 45 and indirectly controls the cooling device 25 via the battery ECU 24 to start cooling control on the charging system by the cooling devices 25 and 45 at the low drive level (Step S123). The low drive level is a level at which drive at Low level and stop are alternately executed. That is, each of the cooling devices 25 and 45 is driven at Low level when the temperature of the cooling target rises over the appropriate temperature range, and is stopped when the temperature of the cooling target falls within the appropriate temperature range.

When determination is made that the charging will not be completed by the desired charging completion time (NO in Step S121), the processor 61 of the EVECU 6 controls the power conversion device 42 to start charging control at the high power level (Step S124). The processor 61 of the EVECU 6 directly controls the cooling device 45 and indirectly controls the cooling device 25 via the battery ECU 24 to start cooling control on the charging system by the cooling devices 25 and 45 at the high drive level (Step S125). The high drive level is a level at which the cooling performance is higher than that of the low drive level and drive at Max level and stop are alternately executed. That is, each of the cooling devices 25 and 45 is driven at Max level when the temperature of the cooling target rises over the appropriate temperature range, and is stopped when the temperature of the cooling target falls within the appropriate temperature range.

After Step S123 or S125 or when determination is made that the external charging is being performed (YES in Step S111), the processor 61 of the EVECU 6 determines whether the charge amount of the battery 21 has reached the necessary charge amount (Step S131).

When determination is made that the necessary charge amount has been reached (YES in Step S131), the processor 61 of the EVECU 6 controls the power conversion device 42 to continue the charging control at the low power level (Step S132). The processor 61 of the EVECU 6 directly controls the cooling device 45 and indirectly controls the cooling device 25 via the battery ECU 24 to continue the cooling control on the charging system by the cooling devices 25 and 45 at the low drive level (Step S133).

When determination is made that the necessary charge amount has not been reached (NO in Step S131) or after Step S133, the processor 61 of the EVECU 6 determines whether the battery 21 is fully charged (Step S134). When determination is made that the battery is fully charged (YES in Step S134), the processor 61 of the EVECU 6 controls the power conversion device 42 to terminate the charging control (Step S135). The processor 61 of the EVECU 6 directly controls the cooling device 45 and indirectly controls the cooling device 25 via the battery ECU 24 to terminate the cooling control on the charging system by the cooling devices 25 and 45 (Step S136).

When determination is made that the battery is not fully charged (NO in Step S134) or after S136, the processor 61 of the EVECU 6 returns the process to be executed to the higher-level process that has called the charging control process.

Figure 3:
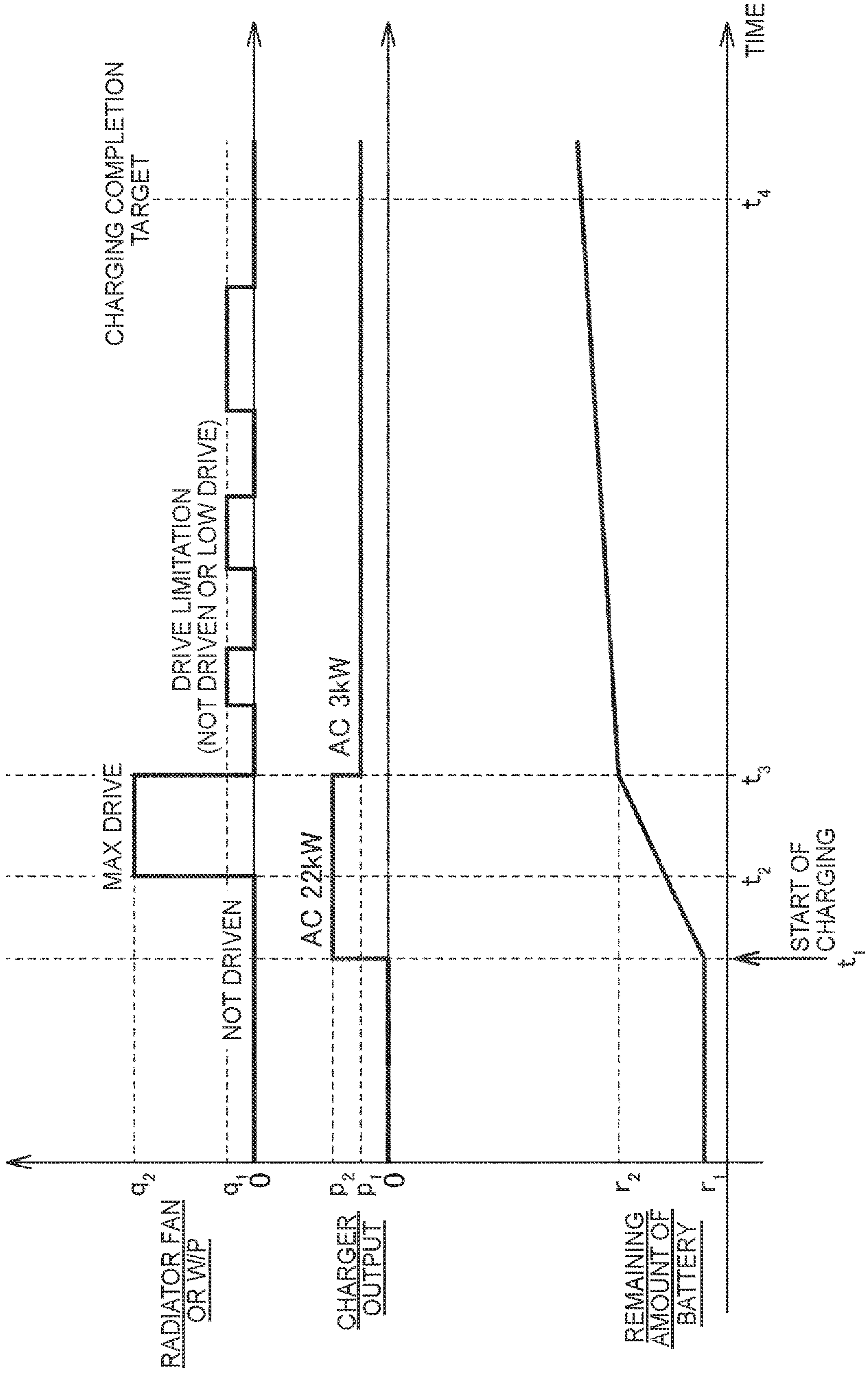
FIG. 3 is a timing chart showing an example of a flow of charging control in the first embodiment.

FIG. 3 is a timing chart showing an example of a flow of the charging control in the first embodiment. Referring to FIG. 3, when the user performs an operation to start charging at a time $t_1$, determination is made as "YES" in Step S112 of FIG. 2 and a necessary charge amount $r_2$ and a desired charging completion time $t_4$ are specified in Steps S114 to S117. In Steps S118 and S121, determination is made as to whether the remaining amount of the battery 21 will reach the necessary charge amount $r_2$ and the charging will be completed by the desired charging completion time $t_4$ when the charging is performed at a low power level $p_1$ ($p_1$=3 kW AC). Specifically, determination is made as to whether current time $t_1+(r_2-r_1)$ (kWh)/3 (kW)$\leq t_4$.

In this example, $t_1+(r_2-r_1)/3>t_4$, that is, the charging will not be completed by the desired charging completion time $t_4$ if the charging is performed at the low power level $p_1$. Therefore, determination is made as "NO" in Step S121. In Step S124, charging control at a high power level $p_2$ ($p_2$=22 kW AC) is started. In Step S125, cooling control on the charging system at the high drive level is started.

As shown in FIG. 3, the cooling fan for the radiator and the water pump in each of the cooling devices 25 and 45 are not driven because the temperature of the coolant does not rise for a while after the charging at the high power level $p_2$ is started. At a time $t_2$, the temperature of the coolant in each of the cooling devices 25 and 45 exceeds the appropriate range, and each of the cooling devices 25 and 45 starts to be driven at Max level.

At a time $t_3$, the remaining amount of the battery 21 reaches the necessary charge amount $r_2$, and determination is made as "YES" in Step S131. In Step S132, the charging control is continued at the low power level $p_1$. In Step S133, the cooling control is continued at the low drive level. After the time $t_3$, each of the cooling devices 25 and 45 is driven at Low level when the temperature of the coolant in each of the cooling devices 25 and 45 exceeds the appropriate range, and is stopped when the temperature is maintained within the appropriate range. Since the battery is not fully charged at the desired charging completion time $t_4$, the time passes over the desired charging completion time $t_4$ without determination as "YES" in Step S134.

Since the drive of the cooling devices 25 and 45 at the high drive level can be minimized in this way, it is possible to minimize the influence of noise of the cooling devices 25 and 45. As a result, it is possible to reduce the influence of the driving noise of the cooling devices 25 and 45 during the charging.

Second Embodiment

In the first embodiment, the battery 21 is charged at the high power level $p_2$ up to the necessary charge amount, and is charged at the low power level $p_1$ after the necessary charge amount has been reached. In a second embodiment, the battery 21 is charged at the high power level $p_2$ up to a predetermined charge amount reachable to the necessary charge amount, and is charged at the low power level $p_1$ after the predetermined charge amount has been reached.

Figure 4:
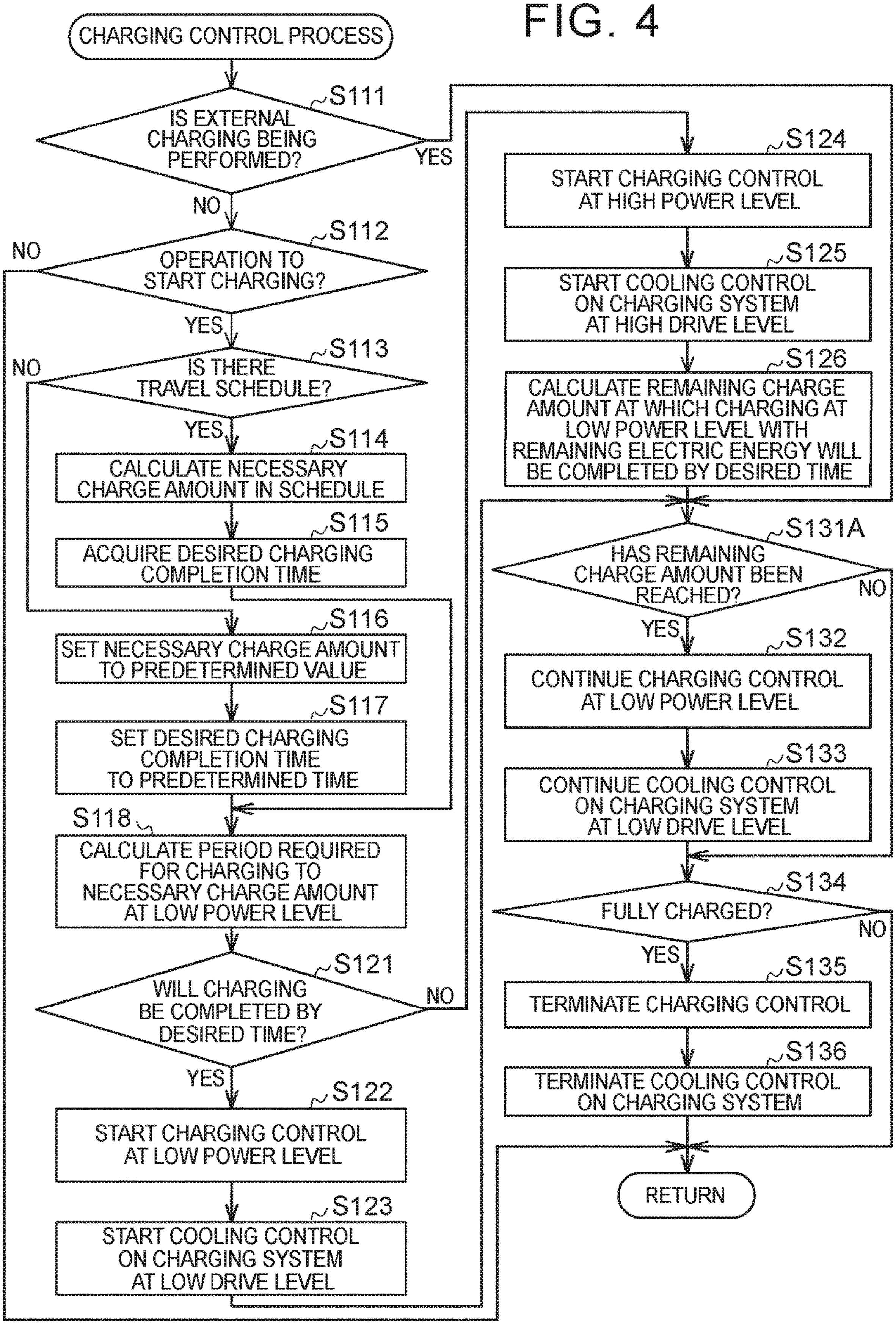
FIG. 4 is a flowchart showing a flow of a charging control process in a second embodiment.

FIG. 4 is a flowchart showing a flow of a charging control process in the second embodiment. Referring to FIG. 4, the charging control process is executed by being called from a higher-level process by the EVECU 6 at predetermined control cycles as in FIG. 2 of the first embodiment. Among the steps in FIG. 4, steps with the same numbers as those in FIG. 2 have the same processing details, and therefore redundant description will not be repeated.

After Step S125, the processor 61 of the EVECU 6 calculates the remaining charge amount of the battery 21 at which the charging at the low power level with the remaining electric energy up to the necessary charge amount will be completed by the desired charging completion time (Step S126).

The processor 61 of the EVECU 6 determines whether the charge amount of the battery 21 has reached the remaining charge amount calculated in Step S126 (Step S131A). When determination is made that the calculated remaining charge amount has been reached (YES in Step S131A), the processor 61 of the EVECU 6 advances the process to be executed to Step S132 described with reference to FIG. 2. When determination is made that the calculated remaining charge amount has not been reached (NO in Step S131A), the processor 61 of the EVECU 6 advances the process to be executed to Step S134 described with reference to FIG. 2.

Figure 5:
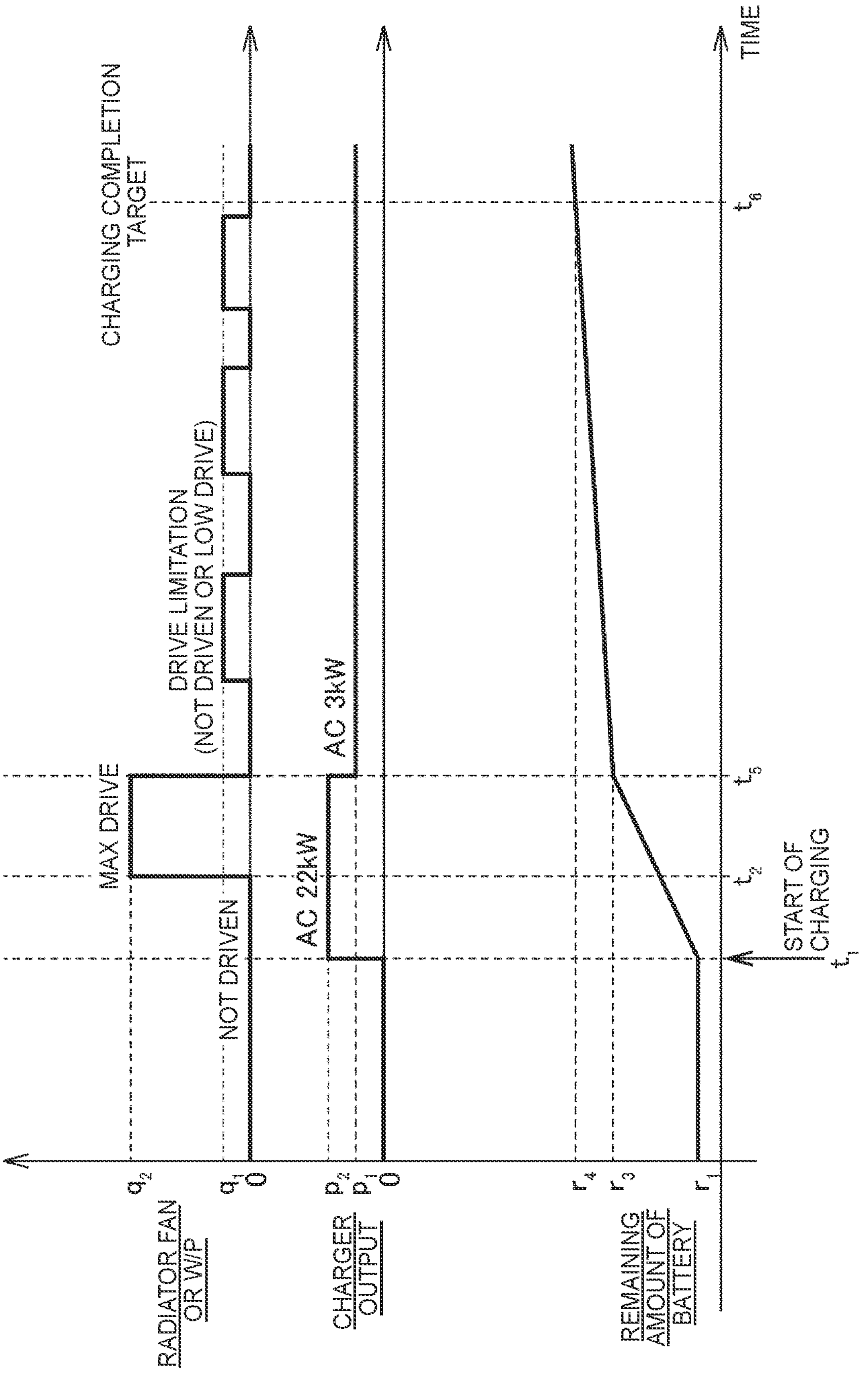
FIG. 5 is a timing chart showing an example of a flow of charging control in the second embodiment.

FIG. 5 is a timing chart showing an example of a flow of the charging control in the second embodiment. Referring to FIG. 5, when the user performs an operation to start charging at a time $t_1$, determination is made as "YES" in Step S112 of FIG. 4 and a necessary charge amount $r_4$ and a desired charging completion time $t_6$ are specified in Steps S114 to S117. In Steps S118 and S121, determination is made as to whether the remaining amount of the battery 21 will reach the necessary charge amount $r_4$ and the charging will be completed by the desired charging completion time $t_6$ when the charging is performed at a low power level $p_1$ ($p_1$=3 kW AC). Specifically, determination is made as to whether current time $t_1+(r_4-r_1)$ (kWh)/3 (kW)$\leq t_6$.

In this example, $t_1+(r_4-r_1)/3>t_6$, that is, the charging will not be completed by the desired charging completion time $t_6$ if the charging is performed at the low power level $p_1$. Therefore, determination is made as "NO" in Step S121. In Step S124, charging control at a high power level $p_2$ ($p_2$=22 kW AC) is started. In Step S125, cooling control on the charging system at the high drive level is started. In Step S126, the remaining charge amount $r_3$ is calculated at which the charging at the low power level $p_1$ with the remaining electric energy will be completed by the desired charging completion time $t_6$. Specifically, a switching time $t_5$ is calculated as $t_5=(r_4+p_2t_1-p_1t_6)/(p_2-p_1)$ based on relationships of charging start time $t_1+(r_3-r_1)/p_2$=switching time $t_5$ and switching time $t_5+(r_4-r_3)/p_1$=desired charging completion time $t_6$. The switching time $t_5$ may be a time after the time $t_5$ calculated by the above expression and before the desired charging completion time $t_6$.

As shown in FIG. 5, the cooling fan for the radiator and the water pump in each of the cooling devices 25 and 45 are not driven because the temperature of the coolant does not rise for a while after the charging at the high power level $p_2$ is started. At a time $t_2$, the temperature of the coolant in each of the cooling devices 25 and 45 exceeds the appropriate range, and each of the cooling devices 25 and 45 starts to be driven at Max level.

At the time $t_5$, the remaining amount of the battery 21 reaches the remaining charge amount $r_3$, and determination is made as "YES" in Step S131A. In Step S132, the charging control is continued at the low power level $p_1$. In Step S133, the cooling control is continued at the low drive level. After the time $t_5$, each of the cooling devices 25 and 45 is driven at Low level when the temperature of the coolant in each of the cooling devices 25 and 45 exceeds the appropriate range, and is stopped when the temperature is maintained within the appropriate range. At the desired charging completion time $t_6$, the necessary charge amount $r_4$ is reached. Since the battery is not fully charged at the desired charging completion time $t_6$, the time passes over the desired charging completion time $t_6$ without determination as "YES" in Step S134.

Since the drive of the cooling devices 25 and 45 at the high drive level can be minimized in this way, it is possible to minimize the influence of noise of the cooling devices 25 and 45. As a result, it is possible to reduce the influence of the driving noise of the cooling devices 25 and 45 during the charging.

Modifications (1) In the above embodiments, the necessary charge amount is specified by the method shown in Step S114 or S116 of FIGS. 2 and 4. However, the present disclosure is not limited to this case. The necessary charge amount may be any value as long as it is the amount of charge necessary for next traveling. For example, the necessary charge amount may be specified based on electric energy presumably consumed in the next traveling, or by estimation based on a travel history of the vehicle 1.

Specifically, a trained model is stored in a memory of a control device such as the memory 62 of the EVECU 6 of the vehicle 1 or in a storage unit (memory or large-capacity storage medium) of a server that can communicate with the vehicle 1. The trained model is a trained model for predicting the next traveling distance using highly correlated parameters by searching for factors influencing the next traveling distance based on vehicle data or travel data. Specifically, the trained model is a trained model obtained by machine learning, learning using a neural network, or deep learning in which a current SOC, an environment around the vehicle 1, and charging start date and time frame when the vehicle has started charging are input values and a distance of next traveling is set as teaching data. A control unit of the control device such as the processor 61 of the EVECU 6 of the vehicle 1 or a processor of the server may receive inputs of a current SOC, an environment around the vehicle 1, and charging start date and time frame when the vehicle has started charging, specify an estimated value of the distance of next traveling by using the trained model, and calculate a necessary charge amount based on the estimated value. There may also be used a learning method based on naive Bayes estimation in which the next traveling distance is predicted from a conditional probability distribution using factors that may have a close correlation with the next prediction, such as information on the day of week or time information when returning home.

(2) In the above embodiments, the desired charging completion time is specified by the method shown in Step S115 or S117 of FIGS. 2 and 4. However, the present disclosure is not limited to this case. The desired charging completion time may be specified in any way. For example, it may be acquired from the user, may be a predetermined time, or may be specified by estimation based on the past charging behavior or the travel history of the vehicle 1.

Specifically, a trained model is stored in a memory of a control device such as the memory 62 of the EVECU 6 of the vehicle 1 or in a storage unit (memory or large-capacity storage medium) of a server that can communicate with the vehicle 1. The trained model is a trained model for predicting the desired charging completion time using highly correlated parameters by searching for factors influencing the desired charging completion time based on vehicle data or travel data. Specifically, the trained model is a trained model obtained by machine learning, learning using a neural network, or deep learning in which a parking place of the vehicle 1 and charging start date and time frame are input values and a length of a connector connection period or a charging completion time is set as teaching data. A control unit of the control device such as the processor 61 of the EVECU 6 of the vehicle 1 or a processor of the server may receive inputs of a parking place of the vehicle 1 and date and time frame at which the charging has been performed, and specify an estimated value of the length of the connector connection period or the charging completion time by using the trained model. There may also be used a learning method based on naive Bayes estimation in which the charging completion time is predicted from a conditional probability distribution using factors that may have a close correlation with the next prediction, such as information on the day of week or time information when returning home.

(3) In the above embodiments, as shown in the combination of Steps S122 and S123, the combination of Steps S124 and S125, and the combination of Steps S132 and S133 in FIGS. 2 and 4, the charging control at the high power level and the cooling control at the high drive level are executed at the same timing, and the charging control at the low power level and the cooling control at the low drive level are executed at the same timing. That is, the cooling devices are controlled at the high drive level during the charging at the high power level, while the cooling devices are controlled at the low drive level during the charging at the low power level.

However, the present disclosure is not limited to this case. The charging control at the high power level and the cooling control at the high drive level may be executed at different timings, and the charging control at the low power level and the cooling control at the low drive level may be executed at different timings. For example, the cooling control at the high drive level may be started at a timing when the cooling of the battery 21 or the power conversion device 42 is necessary after the start timing of the charging control at the high power level.

(4) In the above embodiments, as shown in Steps S122 and S132 in FIGS. 2 and 4, the charging is performed at the low power level when it is completed by the desired charging completion time. However, the present disclosure is not limited to this case. The power conversion device 42 may be controlled to charge the battery 21 at the high power level instead of the low power level when the current time is within a time frame (for example, daytime) during which the influence of noise is smaller than those in the other time frames (for example, nighttime) or when the current time has entered the time frame during which the influence of noise is small. As a result, quick charging can be performed in the time frame during which the influence of noise is small.

The power conversion device 42 may be controlled to charge the battery 21 at the high power level instead of the low power level when the current location of the vehicle 1 is a location (for example, an industrial or commercial location) where the influence of noise is smaller than those in the other locations (for example, a residential area). As a result, quick charging can be performed in the location where the influence of noise is small.

Selection of a noise reduction mode or a charging priority mode may be received from the user, and the power conversion device 42 may be controlled to charge the battery 21 at the high power level instead of the low power level when the selection of the charging priority mode is received. As a result, quick charging can be performed in accordance with the user's intention.

(5) In the above embodiments, the low power level and the high power level are set to the constant values (3 kW AC and 22 kW AC), respectively. However, the present disclosure is not limited to this case as long as the high power level is higher than the low power level. The low power level may be a multi-stage value (for example, a value switchable between two stages that are 3 kW AC and 10 kW AC) or a variable (for example, a variable between 3 kW AC and 10 kW AC). Similarly, the high power level may be a multi-stage value (for example, a value switchable between two stages that are 22 kW AC and 10 kW AC) or a variable (for example, a variable between 22 kW AC and 10 kW AC).

(6) In the above embodiments, the low drive level is the multi-stage value (for example, a value switchable between two stages that are Low level and stop). The high drive level is not constantly a level of high drive (for example, Max level and Mid level) but is a level switchable between high drive and low drive (Low level and stop). Specifically, the high drive level is the multi-stage value (for example, a value switchable between two stages that are Max level and stop).

However, the present disclosure is not limited to this case as long as the cooling performance of the high drive level is higher than that of the low drive level. The low drive level may be a constant value (for example, Low level or stop), any other multi-stage value (for example, a value switchable between two stages that are Mid level and Low level), or a variable (for example, a variable between Mid level and Low level or between Mid level and stop). Similarly, the high drive level may be a constant value (for example, Max level), any other multi-stage value (for example, a value switchable between two stages that are Max level and Low level, among three stages that are Max level, Mid level, and Low level, or among three stages that are Max level, Low level, and stop), or a variable (for example, a variable between Max level and Low level or between Max level and stop).

(7) In the above embodiments, the cooling devices 25 and 45 are provided independently. However, the present disclosure is not limited to this case. The cooling devices 25 and 45 may be provided integrally. For example, the coolant systems of the cooling devices 25 and 45 may communicate with each other. The cooling devices 25 and 45 may be provided integrally with another cooling device (for example, a cooling device for the PCU 31 or the motor generator 32). One of the cooling devices 25 and 45 may be provided alone.

(8) In the above embodiments, the desired charging completion time is specified as shown in Steps S115 and S117 of FIGS. 2 and 4. However, the present disclosure is not limited to this case. The desired charging completion time may be a scheduled traveling start time or simply a time at which the user wishes to complete charging regardless of whether the vehicle starts traveling at that time.

(9) In the above embodiments, the EVECU 6 controls the cooling by the cooling devices 25 and 45. However, the present disclosure is not limited to this case. Another control device such as the battery ECU 24 may control the cooling by the cooling devices 25 and 45. The EVECU 6 controls the charging of the battery 21. However, the present disclosure is not limited to this case. Another control device such as the battery ECU 24 may control the charging of the battery 21.

(10) The above embodiments can be regarded as disclosure of a charging control device such as the EVECU 6 or the battery ECU 24, disclosure of a charging control system or a vehicle 1 including the charging control device, disclosure of a charging control method to be performed by the charging control device, the charging control system, or the vehicle 1, or disclosure of a program of a charging control process to be executed by the charging control device or a recording medium recording the program.

CONCLUSION (1) As shown in FIG. 1, the charging control device (for example, the EVECU 6 or the battery ECU 24) is configured to control the external charging of the vehicle 1. As shown in FIG. 1, the vehicle 1 includes the battery 21 configured to store electric power for traveling of the vehicle 1, the power conversion device 42 configured to convert electric power from the outside of the vehicle 1 into electric power adapted to the battery 21, the cooling device 25 or 45 configured to cool at least one of the battery 21 and the power conversion device 42, and the charging control device. As shown in FIG. 1, the charging control device includes the processor 61 or 241 configured to control the power conversion device 42 and the cooling device 25 or 45.

As shown in FIG. 2, the low power level is the level of charging power at which the appropriate temperature range can be maintained by the cooling control at the low drive level of the cooling device 25 or 45. As shown in FIG. 2, the high power level higher than the low power level is the level of charging power at which the appropriate temperature range cannot be maintained by the cooling control at the low drive level but can be maintained by the cooling control at the high drive level at which the cooling performance is higher than that of the low drive level. As shown in FIGS. 2 and 4, the processor 61 or 241 specifies the necessary charge amount of the battery 21 (for example, Step S114 or S116), and controls the power conversion device 42 to charge the battery 21 at the high power level up to the predetermined charge amount reachable to the specified necessary charge amount (for example, the predetermined charge amount may be equal to the necessary charge amount as shown in FIGS. 2 and 3, or may be, as shown in FIGS. 4 and 5, the charge amount in which the time obtained by adding the period required for charging to the predetermined charge amount at the high power level and the period required for charging from the predetermined charge amount to the necessary charge amount at the low power level to the time at the start of charging is earlier than the expected charging completion time) (for example, Step S124) and to charge the battery 21 at the low power level after the predetermined charge amount has been reached (for example, Step S132).

Therefore, the battery 21 is charged, up to the predetermined charge amount reachable to the necessary charge amount, at the high power level at which the appropriate temperature range cannot be maintained unless the cooling control is performed at the high drive level, and the battery 21 is charged, after the predetermined charge amount has been reached, at the low power level at which the appropriate temperature range can be maintained by the cooling control at the low drive level. Thus, it is possible to minimize the influence of noise of the cooling device at the high drive level. As a result, it is possible to reduce the influence of the driving noise of the cooling device 25 or 45 during the charging.

(2) As shown in FIGS. 2 and 4, the processor 61 or 241 may control the cooling device 25 or 45 at the high drive level during the charging at the high power level (for example, Step S125), and control the cooling device 25 or 45 at the low drive level during the charging at the low power level (for example, Steps S123 and S133). Thus, the control can be simplified.

(3) As shown in FIGS. 2 and 4, the processor 61 or 241 may specify the necessary charge amount based on the electric energy presumably consumed in the next travel schedule (for example, Step S114). As a result, the charging can be performed for the charge amount necessary for the next traveling at the minimum high power level.

(4) As shown in FIGS. 2 and 3, the predetermined charge amount may be equal to the necessary charge amount. Thus, quick charging can be performed at the high power level up to the necessary charge amount.

(5) As shown in FIGS. 4 and 5, the processor 61 or 241 may acquire the expected charging completion time (for example, Step S115 or S117), and calculate the predetermined charge amount in which the time obtained by adding the period required for charging to the predetermined charge amount (for example, the remaining charge amount calculated in Step S126) at the high power level and the period required for charging from the predetermined charge amount to the necessary charge amount at the low power level to the time at the start of charging is earlier than the expected time (for example, Step S126).

Therefore, the charging can be performed at the high power level up to the predetermined charge amount before the necessary charge amount is reached, and can be performed at the low power level after the predetermined charge amount has been reached. As a result, the charging period at the high power level can be minimized.

(6) The processor 61 or 241 may specify the necessary charge amount by estimation based on the travel history of the vehicle 1. As a result, it is possible to improve the accuracy of estimation of the necessary charge amount.

(7) As shown in FIG. 1, the charging control device (for example, the EVECU 6 or the battery ECU 24) is configured to control the external charging of the vehicle 1. As shown in FIG. 1, the vehicle 1 includes the battery 21 configured to store electric power for traveling of the vehicle 1, the power conversion device 42 configured to convert electric power from the outside of the vehicle 1 into electric power adapted to the battery 21, the cooling device 25 or 45 configured to cool at least one of the battery 21 and the power conversion device 42, and the charging control device. As shown in FIG. 1, the charging control device includes the processor 61 or 241 configured to control the power conversion device 42 and the cooling device 25 or 45.

As shown in FIG. 2, the low power level is the level of charging power at which the appropriate temperature range can be maintained by the cooling control at the low drive level of the cooling device 25 or 45. The high power level higher than the low power level is the level of charging power at which the appropriate temperature range cannot be maintained by the cooling control at the low drive level but can be maintained by the cooling control at the high drive level at which the cooling performance is higher than that of the low drive level. As shown in FIGS. 2 and 4, the processor 61 or 241 specifies the necessary charge amount of the battery 21 (for example, Step S114 or S116), specifies the expected charging completion time (for example, Step S115 or S117), controls the power conversion device 42 to charge the battery 21 at the low power level when the specified expected time is later than the completion time obtained by adding the period required for charging to the specified necessary charge amount at the low power level to the time at the start of charging (for example, Step S122), and controls, when the expected time is not later than the completion time, the power conversion device 42 to charge the battery 21 at the high power level up to the predetermined charge amount reachable to the specified necessary charge amount by the expected time (for example, Step S124) and to charge the battery 21 at the low power level after the predetermined charge amount has been reached (for example, Step S132).

Therefore, when the charging can be performed up to the necessary charge amount by the expected time at the low power level at which the appropriate temperature range can be maintained by the cooling control at the low drive level, the battery 21 is charged at the low power level. When the charging cannot be performed up to the necessary charge amount by the expected time, the battery 21 is charged, up to the predetermined charge amount reachable to the necessary charge amount, at the high power level at which the appropriate temperature range cannot be maintained unless the cooling control is performed at the high drive level, and the battery 21 is charged at the low power level after the predetermined charge amount has been reached. Thus, it is possible to minimize the influence of noise of the cooling device 25 or 45 at the high drive level. As a result, it is possible to reduce the influence of the driving noise of the cooling device 25 or 45 during the charging.

(8) As shown in FIGS. 2 and 4, the processor 61 or 241 may control the cooling device 25 or 45 at the high drive level during the charging at the high power level (for example, Step S125), and control the cooling device 25 or 45 at the low drive level during the charging at the low power level (for example, Steps S123 and S133). Thus, the control can be simplified.

(9) The processor 61 or 241 may control the power conversion device 42 to charge the battery 21 at the high power level instead of the low power level when the current time is within a time frame (for example, daytime) during which the influence of noise is smaller than those in the other time frames (for example, nighttime). As a result, quick charging can be performed in the time frame during which the influence of noise is small.

(10) The processor 61 or 241 may control the power conversion device 42 to charge the battery 21 at the high power level instead of the low power level when the current location is a location (for example, an industrial or commercial location) where the influence of noise is smaller than those in the other locations (for example, a residential area). As a result, quick charging can be performed in the location where the influence of noise is small.

(11) The processor 61 or 241 may receive selection of the noise reduction mode or the charging priority mode from the user, and control the power conversion device 42 to charge the battery 21 at the high power level instead of the low power level when the selection of the charging priority mode is received. As a result, quick charging can be performed in accordance with the user's intention.

(12) The processor 61 or 241 may specify the desired charging completion time by estimation based on the travel history of the vehicle 1. As a result, it is possible to improve the accuracy of estimation of the necessary charge amount.

The embodiments disclosed herein shall be construed as illustrative and not restrictive in all respects. The scope of the present disclosure is shown by the claims rather than by the above description of the embodiments, and is intended to include all modifications within the meaning and scope equivalent to the claims.

A charging control device according to a first aspect of the present disclosure is a charging control device configured to control external charging of a vehicle, the vehicle including a power storage device configured to store electric power for traveling of the vehicle, a conversion device configured to convert electric power from an outside of the vehicle into electric power adapted to the power storage device, a cooling device configured to cool at least one of the power storage device and the conversion device, and the charging control device, the charging control device includes: one or more processors configured to: control the conversion device and the cooling device; specify a necessary charge amount of the power storage device; and control the conversion device such that the power storage device is charged at a high power level up to a predetermined charge amount reachable to the specified necessary charge amount, and such that the power storage device is charged at a low power level after the predetermined charge amount has been reached, the low power level being a level of charging power at which an appropriate temperature range is maintained by cooling control at a low drive level of the cooling device, the high power level being higher than the low power level in terms of charging power and being a level of charging power at which the appropriate temperature range is not maintained by the cooling control at the low drive level but is maintained by cooling control at a high drive level at which cooling performance is higher than cooling performance of the low drive level.

According to such a configuration, the power storage device is charged, up to the predetermined charge amount reachable to the necessary charge amount, at the high power level at which the appropriate temperature range cannot be maintained unless the cooling control is performed at the high drive level, and the power storage device is charged, after the predetermined charge amount has been reached, at the low power level at which the appropriate temperature range can be maintained by the cooling control at the low drive level. Thus, it is possible to minimize the influence of noise of the cooling device at the high drive level. As a result, it is possible to provide the charging control device capable of reducing the influence of the driving noise of the cooling device during the charging.

The one or more processors may be configured to control the cooling device at the high drive level during charging at the high power level, and control the cooling device at the low drive level during charging at the low power level. According to such a configuration, the control can be simplified.

The one or more processors may be configured to specify the necessary charge amount based on electric energy presumably consumed in a next travel schedule. According to such a configuration, the charging can be performed for the charge amount necessary for the next traveling at the minimum high power level.

The predetermined charge amount may be equal to the necessary charge amount. According to such a configuration, quick charging can be performed at the high power level up to the necessary charge amount.

The one or more processors may be configured to acquire an expected time of completion of charging, and calculate the predetermined charge amount such that a time obtained by adding, to a time at a start of charging, a period required for charging to the predetermined charge amount at the high power level and a period required for charging from the predetermined charge amount to the necessary charge amount at the low power level is earlier than the expected time.

According to such a configuration, the charging can be performed at the high power level up to the predetermined charge amount before the necessary charge amount is reached, and can be performed at the low power level after the predetermined charge amount has been reached. As a result, the charging period at the high power level can be minimized.

The one or more processors may be configured to specify the necessary charge amount by estimation based on a travel history of the vehicle. According to such a configuration, it is possible to improve the accuracy of estimation of the necessary charge amount.

A charging control device according to a second aspect of the present disclosure is a charging control device configured to control external charging of a vehicle, the vehicle including a power storage device configured to store electric power for traveling of the vehicle, a conversion device configured to convert electric power from an outside of the vehicle into electric power adapted to the power storage device, a cooling device configured to cool at least one of the power storage device and the conversion device, and the charging control device, the charging control device includes: one or more processors configured to: control the conversion device and the cooling device; specify a necessary charge amount of the power storage device; specify an expected time of completion of charging; control the conversion device such that the power storage device is charged at a low power level when the specified expected time is later than a completion time obtained by adding a period required for charging to the specified necessary charge amount at the low power level to a time at a start of charging; and control, when the expected time is not later than the completion time, the conversion device such that the power storage device is charged at a high power level up to a predetermined charge amount reachable to the specified necessary charge amount by the expected time, and to charge the power storage device at the low power level after the predetermined charge amount has been reached, the low power level being a level of charging power at which an appropriate temperature range is maintained by cooling control at a low drive level of the cooling device, the high power level being higher than the low power level in terms of charging power and being a level of charging power at which the appropriate temperature range is not maintained by the cooling control at the low drive level but is maintained by cooling control at a high drive level at which cooling performance is higher than cooling performance of the low drive level.

According to such a configuration, when the charging can be performed up to the necessary charge amount by the expected time at the low power level at which the appropriate temperature range can be maintained by the cooling control at the low drive level, the power storage device is charged at the low power level. When the charging cannot be performed up to the necessary charge amount by the expected time, the power storage device is charged, up to the predetermined charge amount reachable to the necessary charge amount, at the high power level at which the appropriate temperature range cannot be maintained unless the cooling control is performed at the high drive level, and the power storage device is charged at the low power level after the predetermined charge amount has been reached. Thus, it is possible to minimize the influence of noise of the cooling device at the high drive level. As a result, it is possible to provide the charging control device capable of reducing the influence of the driving noise of the cooling device during the charging.

The one or more processors may be configured to control the cooling device at the high drive level during charging at the high power level, and control the cooling device at the low drive level during charging at the low power level. According to such a configuration, the control can be simplified.

The one or more processors may be configured to control the conversion device to charge the power storage device at the high power level instead of the low power level when a current time is within a time frame during which influence of noise is smaller than influence of noise in other time frames. According to such a configuration, quick charging can be performed in the time frame during which the influence of noise is small.

The one or more processors may be configured to control the conversion device to charge the power storage device at the high power level instead of the low power level when a current location is a location where influence of noise is smaller than influence of noise in other locations. According to such a configuration, quick charging can be performed in the location where the influence of noise is small.

The one or more processors may be configured to receive selection of a noise reduction mode or a charging priority mode from a user, and control the conversion device to charge the power storage device at the high power level instead of the low power level when the selection of the charging priority mode is received. According to such a configuration, quick charging can be performed in accordance with the user's intention.

The one or more processors may be configured to specify the expected time by estimation based on a travel history of the vehicle. According to such a configuration, it is possible to improve the accuracy of estimation of the necessary charge amount.

The predetermined charge amount may be equal to the necessary charge amount.

What is claimed is:

1. A charging control device configured to control external charging of a vehicle, the vehicle including a power storage device configured to store electric power for traveling of the vehicle, a conversion device configured to convert electric power from an outside of the vehicle into electric power adapted to the power storage device, a cooling device configured to cool at least one of the power storage device and the conversion device, and the charging control device, the charging control device comprising one or more processors configured to:

control the conversion device and the cooling device;

specify a necessary charge amount of the power storage device; and control the conversion device such that the power storage device is charged at a high power level up to a predetermined charge amount reachable to the specified necessary charge amount, and such that the power storage device is charged at a low power level after the predetermined charge amount has been reached, the low power level being a constant level of charging power at which an appropriate temperature range is maintained by cooling control at a low drive level of the cooling device, the high power level being higher than the low power level in terms of charging power and being a constant level of charging power at which the appropriate temperature range is not maintained by the cooling control at the low drive level but is maintained by cooling control at a high drive level at which cooling performance is higher than cooling performance of the low drive level.

2. The charging control device according to claim 1, wherein the one or more processors are configured to control the cooling device at the high drive level during charging at the high power level, and control the cooling device at the low drive level during charging at the low power level.

3. The charging control device according to claim 1, wherein the one or more processors are configured to specify the necessary charge amount based on electric energy presumably consumed in a next travel schedule.

4. The charging control device according to claim 1, wherein the predetermined charge amount is equal to the necessary charge amount.

5. The charging control device according to claim 1, wherein the one or more processors are configured to:

acquire an expected time of completion of charging; and calculate the predetermined charge amount such that a time obtained by adding, to a time at a start of charging, a period required for charging to the predetermined charge amount at the high power level and a period required for charging from the predetermined charge amount to the necessary charge amount at the low power level is earlier than the expected time.

6. The charging control device according to claim 1, wherein the one or more processors are configured to specify the necessary charge amount by estimation based on a travel history of the vehicle.

7. A charging control device configured to control external charging of a vehicle, the vehicle including a power storage device configured to store electric power for traveling of the vehicle, a conversion device configured to convert electric power from an outside of the vehicle into electric power adapted to the power storage device, a cooling device configured to cool at least one of the power storage device and the conversion device, and the charging control device, the charging control device comprising one or more processors configured to:

control the conversion device and the cooling device;

specify a necessary charge amount of the power storage device;

specify an expected time of completion of charging;

control the conversion device such that the power storage device is charged at a low power level when the specified expected time is later than a completion time obtained by adding a period required for charging to the specified necessary charge amount at the low power level to a time at a start of charging; and control, when the expected time is not later than the completion time, the conversion device such that the power storage device is charged at a high power level up to a predetermined charge amount reachable to the specified necessary charge amount by the expected time, and to charge the power storage device at the low power level after the predetermined charge amount has been reached, the low power level being a constant level of charging power at which an appropriate temperature range is maintained by cooling control at a low drive level of the cooling device, the high power level being higher than the low power level in terms of charging power and being a constant level of charging power at which the appropriate temperature range is not maintained by the cooling control at the low drive level but is maintained by cooling control at a high drive level at which cooling performance is higher than cooling performance of the low drive level.

8. The charging control device according to claim 7, wherein the one or more processors are configured to control the cooling device at the high drive level during charging at the high power level, and control the cooling device at the low drive level during charging at the low power level.

9. The charging control device according to claim 7, wherein the one or more processors are configured to control the conversion device to charge the power storage device at the high power level instead of the low power level when a current time is within a time frame during which influence of noise is smaller than influence of noise in other time frames.

10. The charging control device according to claim 7, wherein the one or more processors are configured to control the conversion device to charge the power storage device at the high power level instead of the low power level when a current location is a location where influence of noise is smaller than influence of noise in other locations.

11. The charging control device according to claim 7, wherein the one or more processors are configured to:

receive selection of a noise reduction mode or a charging priority mode from a user; and control the conversion device to charge the power storage device at the high power level instead of the low power level when the selection of the charging priority mode is received.

12. The charging control device according to claim 7, wherein the one or more processors are configured to specify the expected time by estimation based on a travel history of the vehicle.

13. The charging control device according to claim 7, wherein the predetermined charge amount is equal to the necessary charge amount.

* * * * *